(12) United States Patent
Yang

(10) Patent No.: US 9,305,794 B2
(45) Date of Patent: Apr. 5, 2016

(54) ETCHING METHOD AND ETCHING COMPOSITION

(71) Applicant: MACRONIX International Co., Ltd., Hsinchu (TW)

(72) Inventor: Ta-Hone Yang, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 5 days.

(21) Appl. No.: 14/246,527

(22) Filed: Apr. 7, 2014

(65) Prior Publication Data

US 2015/0287608 A1    Oct. 8, 2015

(51) Int. Cl.
| | |
|---|---|
| *H01L 21/30* | (2006.01) |
| *H01L 21/306* | (2006.01) |
| *C09K 13/00* | (2006.01) |
| *C09K 13/02* | (2006.01) |
| *C09K 13/04* | (2006.01) |
| *C09K 13/06* | (2006.01) |
| *C09K 13/08* | (2006.01) |
| *C23F 1/10* | (2006.01) |
| *C23F 1/12* | (2006.01) |

(52) U.S. Cl.
CPC .......... *H01L 21/30604* (2013.01); *C09K 13/00* (2013.01); *C09K 13/02* (2013.01); *C09K 13/04* (2013.01); *C09K 13/06* (2013.01); *C09K 13/08* (2013.01); *C23F 1/10* (2013.01); *C23F 1/12* (2013.01)

(58) Field of Classification Search
CPC ........... H01L 21/76254; C08G 18/831; C08G 9/08795
See application file for complete search history.

(56) References Cited

U.S. PATENT DOCUMENTS

| | | | | |
|---|---|---|---|---|
| 7,098,085 | B2* | 8/2006 | Yamanaka | .......... H01L 27/1285 257/E21.101 |
| 7,682,860 | B2* | 3/2010 | Ouellet | ............... B81C 1/00269 438/458 |
| 8,632,510 | B2* | 1/2014 | Ferrari | ................. A61K 9/0097 604/288.01 |

OTHER PUBLICATIONS

Pease et al., "Luminescent Chemically-etched Porous Poly-Crystalline Silicon on Insulating Substrates," Journal of Electronic Materials, Aug. 2000, vol. 29, Issue 8, pp. 1033-1037.

* cited by examiner

*Primary Examiner* — Telly Green
*Assistant Examiner* — Andre' C Stevenson
(74) *Attorney, Agent, or Firm* — J.C. Patents

(57) ABSTRACT

An etching method is disclosed. A substrate is provided. An etching is performed to form at least one opening in the substrate. An auxiliary etching layer is formed in the opening to cover at least one etching residue. The auxiliary etching layer includes a media, a carrier and an etching component encapsulated by the carrier. A treatment process is performed to the auxiliary etching layer. The treatment process includes applying an energy to the auxiliary etching layer or exposing the auxiliary layer to a gas, so that the carrier breaks in the treatment and thereby the etching component is released to etch the etching residue.

13 Claims, 4 Drawing Sheets

ETCHING METHOD AND ETCHING COMPOSITION

BACKGROUND OF THE INVENTION

1. Field of Invention

The present invention relates to a semiconductor process and a composition for the same, and more particularly to an etching method and an etching composition.

2. Description of Related Art

As the demand for high-density memories such as floating gate memories, charge trapping memories, non-volatile memories or embedded memories is increased, the design of memory units is changed from a planar structure to a three-dimensional structure, so as to increase the storage capacity in a limited chip area.

In a three-dimensional structure, in order to achieve a higher storage capacity, the number of layers of stacks is increased, and the aspect ratio during an etching is accordingly enhanced. However, the reaching depths of ions used in an etching step such as an anisotropic etching are limited, so that incomplete etching is easily observed, and stepped residues may remain at the bottom of the trench. In such case, the formed device may be turned on abnormally due to the undesired residues, and short current may be generated.

SUMMARY OF THE INVENTION

The present invention provides an etching method and an etching composition to effectively remove the stepped residues caused by incomplete etching.

The present invention provides an etching method. A substrate is provided. An etching is performed to form at least one opening in the substrate. An auxiliary etching is performed to remove at least one etching residue in the opening. The auxiliary etching includes forming an auxiliary etching layer to cover the etching residue. The auxiliary etching layer includes an etching component. A treatment process is performed to the auxiliary etching layer, so that the etching component etches the etching residue.

According to an embodiment of the present invention, the auxiliary etching layer includes a media, a carrier disposed in the media and the etching component encapsulated by the carrier. The treatment process includes applying an energy to the auxiliary etching layer or exposing the auxiliary layer to a gas.

According to an embodiment of the present invention, the energy includes heat, ray, light, microwave, radiation, gravity, centrifugal force, electric field, magnetic force, mechanical energy or a combination thereof.

According to an embodiment of the present invention, the gas includes ozone.

According to an embodiment of the present invention, the etching component includes alkali hydroxide, quaternary ammonium hydroxide, hydrofluoric acid, a mixture of hydrofluoric acid and inorganic acid, a mixture of hydrofluoric acid and organic acid, a fluorine-containing gas or a combination thereof.

According to an embodiment of the present invention, the carrier includes active carbon, a nano-porous material, carbon nanotube (CNT) or a combination thereof.

According to an embodiment of the present invention, the carrier includes a capsule, and the capsule breaks in the treatment process so as to release the etching component.

According to an embodiment of the present invention, the capsule includes thermoplastic resin, photosensitive resin or a combination thereof.

According to an embodiment of the present invention, the media is a fluid, the media includes an organic material, and the organic material includes photoresist, bottom anti-reflection coating (BARC) or spin-on-glass (SOG).

According to an embodiment of the present invention, the media is a fluid, and the media includes an inorganic material.

According to an embodiment of the present invention, the step of forming the auxiliary etching layer in the opening includes forming the auxiliary etching layer on the substrate to at least fill up the opening, and removing a portion of the auxiliary etching layer.

The present invention further provides an etching composition including a media, a carrier disposed in the media and an etching component, encapsulated by the carrier.

According to an embodiment of the present invention, the etching component includes alkali hydroxide, quaternary ammonium hydroxide, hydrofluoric acid, a mixture of hydrofluoric acid and inorganic acid, a mixture of hydrofluoric acid and organic acid, a fluorine-containing gas or a combination thereof.

According to an embodiment of the present invention, the carrier includes active carbon, a nano-porous material, carbon nanotube (CNT) or a combination thereof.

According to an embodiment of the present invention, the carrier includes a capsule.

According to an embodiment of the present invention, the capsule includes thermoplastic resin, photosensitive resin or a combination thereof.

According to an embodiment of the present invention, the media is a fluid, the media includes an organic material, and the organic material includes photoresist, bottom anti-reflection coating (BARC) or spin-on-glass (SOG).

According to an embodiment of the present invention, the media is a fluid, and the media includes an inorganic material.

In view of the above, the etching method and composition provided by the present invention can effectively remove the stepped residues caused by incomplete etching.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
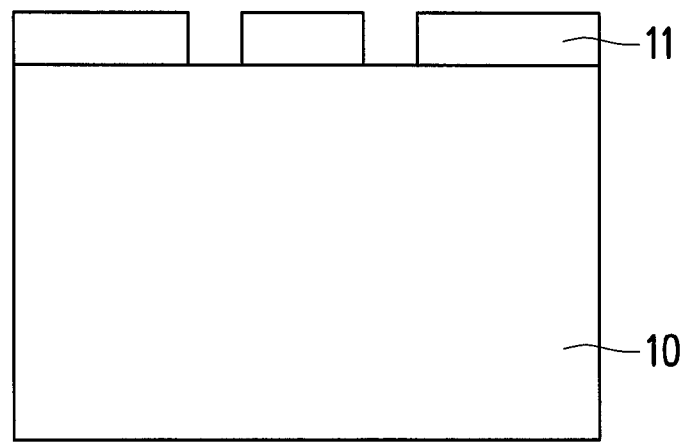
FIG. 1A to FIG. 1F are cross-sectional views illustrating an etching method according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, the etching method and the etching composition of the invention are applied to an etching process for a silicon substrate. However, the present invention is not limited thereto. People having ordinary skill in the art should be appreciated that, as long as a suitable etching component is used, the etching method and the etching composition of the invention can be applied to various substrates such as semiconductor, metal, insulating material, ceramics, organic polymer, etc. The insulating material includes oxide (e.g. silicon oxide) or carbide (e.g. silicon carbide).

FIG. 1A to FIG. 1F are cross-sectional views illustrating an etching method according to an embodiment of the present invention. FIG. 2 is a flow chart of an etching method of the present invention.

Figure 2:
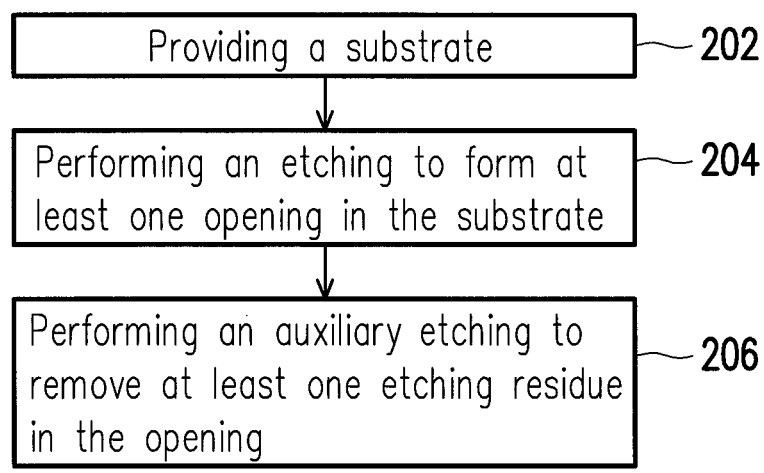
FIG. 2 is a flow chart of an etching method of the present invention.

Referring to FIG. 1A and FIG. 2, in step 202, a substrate 10 is provided. In an embodiment, the substrate 10 includes silicon. In another embodiment, the substrate 10 can include at least one material selected from the group consisting of Ge, SiGe, GaP, GaAs, SiC, SiGeC, InAs and InP. Besides, the substrate 10 can be a single-layer or multi-layer structure. In an embodiment, the substrate 10 can be a stacked structure including insulating layers and polysilicon layers arranged alternately. Afterwards, a patterned photoresist 11 is formed on the substrate 10 with a photolithography process.

Figure 1B:
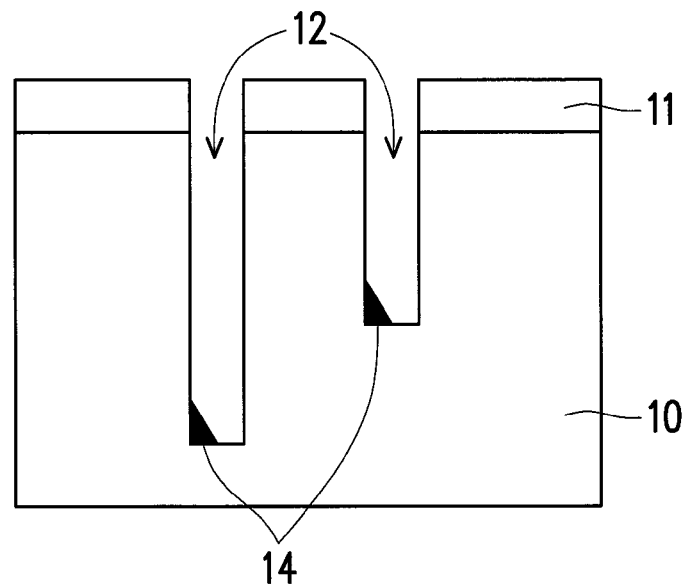

Referring to FIG. 1B and FIG. 2, in step 204, an etching process is performed to form at least one opening 12 in the substrate 10. The etching process can be an isotropic or anisotropic etching process. The formed opening 12 has an aspect ratio of 20 or greater than 20. At least one etching residue 14 remains at the bottom of the opening 12 after the etching process. Specifically, the opening 12 has such a high aspect ratio, so that the number of ions reaching the bottom of the opening 12 is decreased, and thus, an incomplete etching occurs and the stepped residue remains at the bottom of the opening 12.

Referring to FIG. 2, in step 206, an auxiliary etching is performed to remove the etching residue 14 in the opening 12.

Figure 1C:
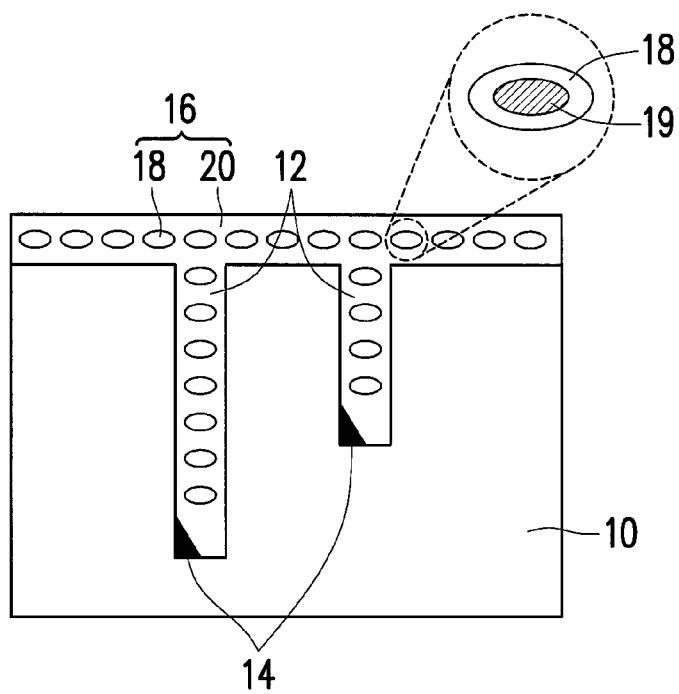

As shown in FIG. 1C, specifically, the auxiliary etching of FIG. 2 in step 206 includes forming an auxiliary etching layer 16 on the substrate 10 to at least fill up the opening 12. The thickness of the auxiliary etching layer 16 can be the same as or different from the height of the opening 12. The auxiliary etching layer 16 can be formed with spin coating, roll coating, dipping, casting, mold coating, bar coating, curtain coating, spray coating, knife coating, dispensing or electrostatic coating, etc. The auxiliary layer 16 includes a media 20, a carrier 18 and an etching component 19. The etching component 19 is encapsulated by the carrier 18.

The media 20, the carrier 18 and the etching component 19 can be present in a form of physically mixture, chemically adsorption or chemical bonding with one another.

The media 20 is a fluid. In an embodiment, the media 20 includes an organic material, such as photoresist, bottom anti-reflection coating (BARC) or spin-on-glass (SOG). In another embodiment, the media 20 includes an inorganic material, such as spin-on-dielectric (SOD).

The carrier 18 is disposed in the media 20 of the auxiliary etching layer 16. In an embodiment, the carrier 18 can include a porous material, such as active carbon. The pore size of the active carbon ranges, for example, from 0.1 nm to 10 nm. The pore size of the active carbon is not limited by the present invention, as long as the pore size is able to adsorb the etching component 19 therein. In another embodiment, the carrier 18 can include a capsule. The capsule includes polymer, such as thermoplastic resin, photosensitive resin or a combination thereof. The thermoplastic resin can be polyimide resin, polyamide resin, polyether resin, polyurethane resin, polyacrylate resin, phenoxy resin or a copolymer of two or more of the said thermoplastic resins. These thermoplastic resins can be used alone or in any combination. The photosensitive resin can be a resin with a photosensitive functional group which is decomposed upon radiation or exposure to light. The photosensitive functional group includes a phenolic group or a diazonaphthoquinone group. The capsule 18 can be particle-like, scale-like, plate-like, needle-like, fibrous, cubic or a combined shape thereof. The particle size of the carrier 18 ranges, for example, from 0.1 nm to 10 nm. The carrier 18 accounts for 10 to 100 volume % of the auxiliary etching layer 16. In addition, the carrier 18 can also include a fluorine-containing chemically bonded material, which can be decomposed to produce a fluorine-containing etching component upon an external energy applied thereon.

The etching component 19 of the auxiliary etching layer 16 can include alkali hydroxide, quaternary ammonium hydroxide or a combination thereof. The alkali hydroxide can be potassium hydroxide or sodium hydroxide. The quaternary ammonium hydroxide can be tetramethylammonium hydroxide, tetraethylammonium hydroxide, benzyl trimethylammonium hydroxide, ethyl trimethyl ammonium hydroxide, 2-hydroxyethyl trimethylammonium hydroxide, benzyl triethyl ammonium hydroxide, cetyltrimethylammonium hydroxide, tetrabutylammonium hydroxide, tetrahexyl ammonium hydroxide, tetrapropylammonium hydroxide or a combination thereof. The amount of the etching component 19 contained in the auxiliary etching layer 16 is not limited by the present invention, as long as this amount is high enough to remove the etching residue 14.

The etching component 19 of the auxiliary etching layer 16 can include hydrofluoric acid, a mixture of hydrofluoric acid and inorganic acid, a mixture of hydrofluoric acid and organic acid or a combination thereof. For example, the inorganic acid includes nitric acid or phosphoric acid, and the organic acid includes a single acid or mixed acid solution. The organic acid can be acetic acid.

The etching component 19 of the auxiliary etching layer 16 can include copper-containing salts or complexes which release copper ions having an etching capability to silicon.

The etching component 19 of the auxiliary etching layer 16 can include a fluorine-containing gas. The fluorine-containing gas includes $NF_3$, $SF_6$, $CF_4$, $ClF_3$, $XeF_2$ or a combination thereof.

The material of the etching component 19 of the auxiliary etching layer 16 is limited by the above. The etching component 19 can be in a type of gas, solid or liquid. In addition, the etching component 19 can include at least one of metal and ions other than the said materials.

In addition, the auxiliary etching layer 16 can further include a solvent. The solvent can be water; monool or polyol, such as glycerol, 1,2-propylene glycol, 1,4-butanediol, 1,3-butanediol, 1,5-pentanediol, 2-ethyl-1-hexenol, ethylene glycol, diethylene glycol or dipropylene glycol; monool or polyol ether, such as ethylene glycol monobutyl ether, triethylene glycol monomethyl ether, diethylene glycol monobutyl ether or dipropylene glycol monomethyl ether; ester, such as ethyl acetate; carbonic ester, such as propylene carbonate; or ketone, such as acetophenone, methyl-2-hexanone, 2-octanone, 4-hydroxy-4-methyl-2-pentanone or 1-methyl-2-pyrrolidone. The said solvents can be used alone or in any combination. The solvent accounts for 10 to 100 volume % of the auxiliary etching layer 16.

In the present invention, a flowable etching composition is used to form the auxiliary etching layer 16, so the formed auxiliary etching layer 16 can be effectively filled into the bottom of the high-aspect-ratio opening 12. Therefore, the etching residue 14 left after the etching can be completely removed by the auxiliary etching layer 16 in the subsequent steps.

Figure 1D:
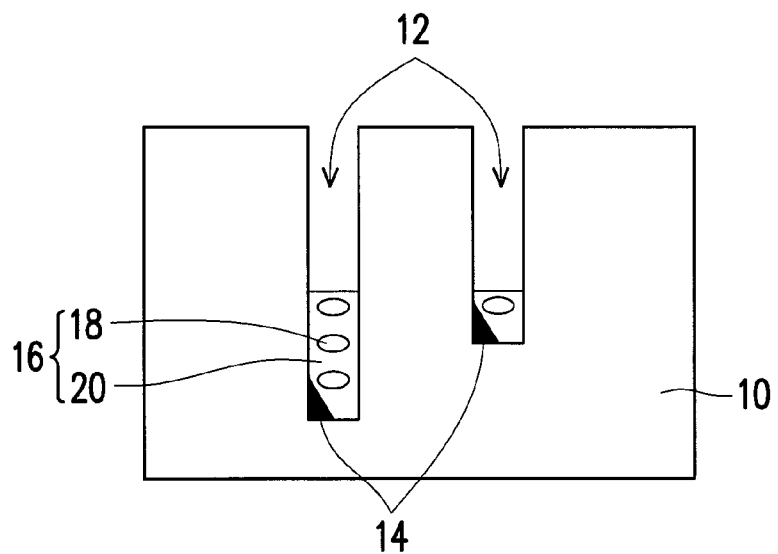

Referring to FIG. 1D, a portion of the auxiliary etching layer 16 is removed, so that the remaining auxiliary etching layer 16 only covers the etching residue 14 in the opening 12 or further covers an area around the etching residue 14. The moving step includes a dry etching or a wet etching. The dry etching uses argon or another inert gas as an etching gas. The wet etching uses an acidic solution or an alkaline solution. Alternatively, the auxiliary etching layer 16 can be directly formed to cover the etching residue 14 without the said removing step in FIG. 1D.

Figure 1E:
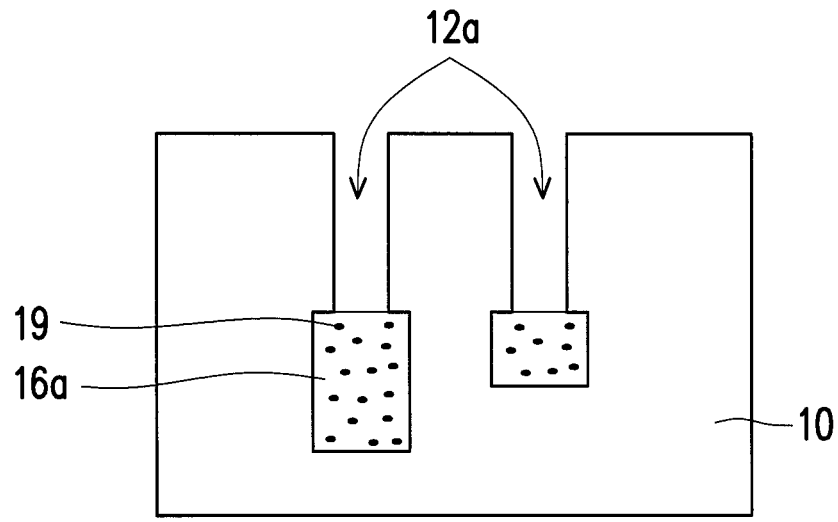

Referring to FIG. 1E, a treatment process is performed to the auxiliary etching layer 16, so that the etching component 19 etches the etching residue 14. The treatment process includes applying an energy to the auxiliary etching layer 16 or exposing the auxiliary layer 16 to a gas, so that the etching component 19 of the auxiliary etching layer 16 is released to etch the etching residue 14 and therefore to form an opening 12a. In an embodiment, the carrier 18 of the auxiliary etching layer 16 is a capsule, and the capsule breaks during the treatment process, and thus, the etching component 19 encapsulated by the capsule is released. In other words, at this moment, the auxiliary etching layer 16a includes the media 20, the broken carrier 18 and the excessive etching component 19 after the removal of the etching residue 14.

The energy includes heat, ray, light, microwave, radiation, gravity, centrifugal force, electric field, magnetic force, mechanical energy or a combination thereof. The gas includes ozone.

The heat is provided by, for example but not limited to, a thermal annealing (under vacuum or at an atmosphere containing nitrogen or argon inert gas), a thermal gradient annealing, a solvent-assisted annealing (at room temperature or higher), a supercritical fluid-assisted annealing or a suitable annealing. The thermal annealing includes a rapid thermal annealing, a UV light annealing or a laser annealing.

The light is provided by, for example but not limited to, a UV light or a visible light. Herein, the light wavelength of the light is not limited by the present invention, as long as the etching component 19 encapsulated by the carrier 18 can be released by the light; e.g. the capsule breaks upon exposure to the light.

The microwave can be, for example but not limited to, a microwave having a frequency of 300 MHz to 300 GHz. Herein, the frequency of the microwave is not limited by the present invention, as long as the etching component 19 encapsulated by the carrier 18 can be released by the microwave; e.g. the capsule breaks upon exposure to the microwave.

The mechanical energy can be provided by, for example but not limited to, pressing the auxiliary etching layer 16, so that the etching component 19 can be released from the carrier 18; e.g. the capsule breaks upon the mechanical energy. For example, vacuum pumping enables the pressure in the capsule greater than the environmental pressure, so that the capsule breaks and the etching component 19 encapsulated by the capsule 18 is accordingly released.

Figure 1F:
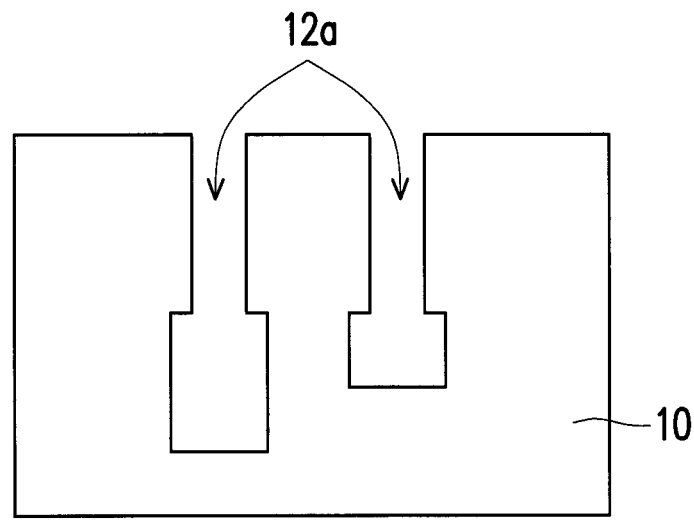

Referring to FIG. 1F, the remaining auxiliary etching layer 16 is removed from the opening 12a. The removing step of FIG. 1F is similar to that of FIG. 1D, and the details are not iterated herein.

In summary, in the present invention, a flowable etching composition is used to form the auxiliary etching layer, so the formed auxiliary etching layer can be effectively filled into the bottom of the high-aspect-ratio opening. Therefore, the stepped etching residue left after the etching can be completely removed by the auxiliary etching layer 16 in the subsequent steps. Besides, with the etching method and composition of the invention, not only the stepped residues but also residues with other shapes can be removed from a narrow and deep slot. In addition, the etching method and composition of the invention can be applied to other device processes other than the high-aspect-ratio trench forming process. Moreover, the etching composition has advantages of easy production, low cost and compatibility with the existing processes.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An etching method, comprising:
   providing a substrate;
   performing an etching to form at least one opening in the substrate; and
   performing an auxiliary etching to remove at least one etching residue in the opening, wherein the auxiliary etching comprises:
     forming an auxiliary etching layer to cover the etching residue, the auxiliary etching layer comprising a media, a carrier disposed in the media, and an etching component encapsulated by the carrier; and
     performing a treatment process to the auxiliary etching layer, so that the etching component etches the etching residue, wherein the treatment process comprises applying an energy to the auxiliary etching layer or exposing the auxiliary layer to a gas, and wherein the carrier comprises a capsule, and the capsule breaks in the treatment process so as to release the etching component.

2. The etching method of claim 1, wherein the energy comprises heat, ray, light, microwave, radiation, gravity, centrifugal force, electric field, magnetic force, mechanical energy or a combination thereof.

3. The etching method of claim 1, wherein the gas comprises ozone.

4. The etching method of claim 1, wherein the etching component comprises alkali hydroxide, quaternary ammonium hydroxide, hydrofluoric acid, a mixture of hydrofluoric acid and inorganic acid, a mixture of hydrofluoric acid and organic acid, a fluorine-containing gas or a combination thereof.

5. The etching method of claim 1, wherein the capsule comprises thermoplastic resin, photosensitive resin or a combination thereof.

6. The etching method of claim 1, wherein the media is a fluid, the media comprises an organic material, and the organic material comprises photoresist, bottom anti-reflection coating (BARC) or spin-on-glass (SOG).

7. The etching method of claim 1, wherein the media is a fluid, and the media comprises an inorganic material.

8. The etching method of claim 1, wherein the step of forming the auxiliary etching layer in the opening comprises:
   forming the auxiliary etching layer on the substrate to at least fill up the opening; and
   removing a portion of the auxiliary etching layer.

9. An etching composition, comprising:
   a media;
   carrier, disposed in the media; and
   an etching component, encapsulated by the carrier,
   wherein the etching composition is used to perform an auxiliary etching, the auxiliary etching removes at least one etching residue in an opening, and the auxiliary etching comprises:
     using the etching composition to form an auxiliary etching layer, the auxiliary etching layer covering the etching residue; and performing a treatment process to the auxiliary etching layer, so that the etching component etches the etching residue, wherein the treatment process comprises applying an energy to the auxiliary etching layer or exposing the auxiliary layer to a gas, and wherein the carrier comprises a capsule, and the capsule breaks in the treatment process so as to release the etching component.

10. The etching composition of claim 9, wherein the etching component comprises alkali hydroxide, quaternary ammonium hydroxide, hydrofluoric acid, a mixture of hydrofluoric acid and inorganic acid, a mixture of hydrofluoric acid and organic acid, a fluorine-containing gas or a combination thereof.

11. The etching composition of claim 9, wherein the capsule comprises thermoplastic resin, photosensitive resin or a combination thereof.

12. The etching composition of claim 9, wherein the media is a fluid, the media comprises an organic material, and the organic material comprises photoresist, bottom anti-reflection coating (BARC) or spin-on-glass (SOG).

13. The etching composition of claim 9, wherein the media is a fluid, and the media comprises an inorganic material.

* * * * *